(12) United States Patent
Na et al.

(10) Patent No.: US 7,741,836 B2
(45) Date of Patent: Jun. 22, 2010

(54) TEST TRAY TRANSFERRING APPARATUS FOR A TEST HANDLER, TEST HANDLER, AND METHOD OF TRANSFERRING TEST TRAYS FOR A TEST HANDLER

(75) Inventors: Yun Sung Na, Cheonan-si (KR); In Gu Jeon, Suwon-si (KR); Tae Hung Ku, Suwon-si (KR); Dong-Hyun Yo, Bucheon-si (KR); Doo-Woo Kim, Yongin-si (KR)

(73) Assignee: Techwing Co., Ltd. (KR)

( * ) Notice: Subject to any disclaimer, the term of this patent is extended or adjusted under 35 U.S.C. 154(b) by 174 days.

(21) Appl. No.: 12/035,555

(22) Filed: Feb. 22, 2008

(65) Prior Publication Data
US 2008/0203999 A1    Aug. 28, 2008

(30) Foreign Application Priority Data
Feb. 28, 2007    (KR)    ............... 10-2007-0020582

(51) Int. Cl.
*G01R 31/28*    (2006.01)

(52) U.S. Cl. ............................................. 324/158.1
(58) Field of Classification Search .................. None
See application file for complete search history.

(56) References Cited

U.S. PATENT DOCUMENTS 6,218,852 B1 * 4/2001 Smith et al. ................. 324/761
2008/0193271 A1  8/2008 Shim et al.

FOREIGN PATENT DOCUMENTS

JP       2007163497 A * 6/2007
KR     10-2007-0021357      2/2007

* cited by examiner

*Primary Examiner*—Paresh Patel
(74) *Attorney, Agent, or Firm*—BainwoodHuang

(57) ABSTRACT

A test handler is disclosed. First and second gripping blocks for respective front and rear test trays to be transferred along a circulation path move together in a circulation direction, but move independently in a direction perpendicular to the circulation path and grip and release independently. The test trays can be transferred by a single power source and interference between an assisting a test and a transferring can be minimized.

7 Claims, 18 Drawing Sheets

US 7,741,836 B2

TEST TRAY TRANSFERRING APPARATUS FOR A TEST HANDLER, TEST HANDLER, AND METHOD OF TRANSFERRING TEST TRAYS FOR A TEST HANDLER

FIELD OF THE INVENTION

The present invention relates to a test handler for assisting a test of manufactured semiconductor devices, and more particularly to an apparatus for transferring test trays.

BACKGROUND OF THE INVENTION

In general, a test handler is an apparatus for assisting semiconductor devices manufactured by a desired manufacturing process to be tested and for classifying the semiconductor devices by a grade according to a test result to load the same in customer trays, and is already disclosed in various published documents.

FIG. 1 is a schematic view illustrating a conventional test handler, and the conventional test handler will be described briefly with reference to FIG. 1 as follows.

As illustrated in FIG. 1, the conventional test handler includes a loading apparatus 110, a soak chamber 120, a test chamber 130, a de-soak chamber 140, and an unloading apparatus 150.

The loading apparatus 110 loads the semiconductor devices accommodated in the customer trays assigned by a reference numeral 101a into a horizontal test tray at a loading position.

The soak chamber 120 is provided to accommodate the loaded test trays sequentially and preheat and pre-cool the semiconductor devices loaded in the test trays. To this end, in the soak chamber 120, a desired temperature is made for the preheating and pre-cooling of the semiconductor devices.

The test chamber 130 is provided to directly assist the test of the semiconductor devices loaded in the test trays which are supplied from the soak chamber 120. To this end, the test chamber 130 includes a mechanical structure for contacting the semiconductor devices loaded in the test trays with test sockets of a tester.

The de-soak chamber 140 is provided to remove heat or chill from hot or cold semiconductor devices.

The unloading apparatus 150 classifies the tested semiconductor devices loaded in the test trays at an unloading position and unloads the same to customer trays assigned by a reference numeral 101b.

Although, in the test handler of FIG. 1, the loading apparatus 110 and the unloading apparatus 150 are separated from each other, if the loading and the unloading are carried out at the same position, a single loading and unloading apparatus may be implemented to perform both of the unloading and the loading.

Meanwhile, currently there are several types of the test handler which are classified in the way that the test trays contact the tester, such as an under head docking type test handler (a way that the test trays contact the test in a horizontal state) and a side docking type test handler (a way that the test trays contact the test in a vertical state), and the test handler as illustrated in FIG. 1 relates to the side docking type test handler. As such, the side docking type test handler needs a posture changing apparatus for changing the posture of the test trays from the horizontal state to the vertical state or vice versa. A reference numeral 160 in FIG. 1 is assigned to a vertical posture changing apparatus for changing the horizontal state of the test tray, the loading of which is finished, into the vertical state and a reference numeral 170 in FIG. 1 is a horizontal posture changing apparatus for changing the vertical state of test tray having the tested semiconductor devices into the horizontal state. In case that changing the posture into the horizontal state and changing the posture into the vertical state are constituted at the same position, the vertical posture changing apparatus and the horizontal posture changing apparatus can be implemented by a single apparatus.

FIGS. 2 and 3 are conceptual plan views of the test handler in FIG. 1.

In FIG. 2, a transferring direction 'a' of the test trays and a transferring direction 'b' of the semiconductor devices in the test handler in FIG. 1 are depicted.

As illustrated in FIG. 3, the test chamber 130 includes a test stand-by unit 131, a test unit 132, and an output stand-by unit 133. In the test stand-by unit 131, the test trays, transferred from the soak chamber 120, stand by to be transferred to the test unit 132. In the test unit 132, the semiconductor devices loaded in the test trays which are transferred from the test stand-by unit 131 are tested, and in the output stand-by unit 133, the test trays having the semiconductor devices tested in the test unit 132, stand by to be outputted to the de-soak chamber 140. In the test chamber 130, the test trays, firstly, are transferred from the test stand-by unit 131 to the test unit 132, and secondly, are transferred from the test unit 132 to the output stand-by unit 133. In this case, according to the related art, the first transferring is carried out by a first test tray transferring apparatus. And the second transferring is carried out over two steps. The test trays in the test unit 132 are pushed by some distance near to the output stand-by unit 133 by the test trays transferred from the test stand-by unit 131 to the test unit 132 according to the first transferring and then, are completely transferred to the output stand-by unit 133 by a second test tray transferring apparatus. For reference, the conventional test tray transferring apparatus is disclosed in Korean Patent Published No. 10-2004-0092786 (entitled 'Test Tray Transferring Apparatus for Semiconductor Device Test Handler') and Korean Patent Published No. 10-2007-0063903 (entitled 'Test Handler', hereinafter referred to 'Related art') filed by this applicant, and FIG. 4 schematically illustrates an application of a test tray transferring apparatus 180 according to the related art.

However, if the first transferring and the second transferring are carried out by a single test tray transferring apparatus 180, the second transferring must be carried out by the test tray transferring apparatus 180 after the first transferring has been performed by the test tray transferring apparatus 180. In this case, during the second transferring, an action of pushing the test trays transferred to the test unit 132 to the tester cannot be carried out. This is because there occurs interference between the test tray transferring apparatus 180 for performing the second transferring and a pushing unit 190 for pushing the test trays to the tester. Thus, since, in this case, the flow of the test trays becomes slow within the test chamber, two test tray transferring apparatuses must be provided.

Moreover, since the second transferring is started by the collision between the test trays, the test trays and the semiconductor devices loaded therein are possibly damaged. Since the second test tray transferring apparatus for completing the second transferring must be provided, two expensive motors must be installed.

SUMMARY OF THE INVENTION

Therefore, the present invention has been made in view of the above problems, and it is an aspect of the present invention to provide a test tray transferring apparatus for transferring a gripping block in a direction perpendicular to a circulation direction so that all the transferring of test trays, which is carried out within a test chamber, is carried out by a single test tray transferring apparatus and interference with a pushing unit can be minimized.

In order to achieve the above aspect, there is provided a test tray transferring apparatus for a test handler comprising: a first gripping block provided to move in a circulation direction of a predetermined circulation path while gripping or releasing a front test tray of two test trays to be circulated along the predetermined circulation path; a second gripping block spaced apart from the first gripping block and provided to move in the circulation direction of the predetermined circulation path while gripping or releasing a rear test tray of the two test trays; a gripping block actuating device for actuating the first gripping block and the second gripping block to grip and release the two test trays; and a gripping block transferring device for transferring the first gripping block and the second gripping block together along the circulation path.

The gripping block actuating device comprises: a first gripping block actuator for actuating the first gripping block; and a second gripping block actuator for actuating the second gripping block independently from the first gripping block actuator.

The gripping block transferring device comprises: a connection frame provided to move in the circulation direction of the predetermined circulation path and including a side with which the first gripping block and the second gripping block are connected to be actuated; a power source for providing a driving force required to transfer the connection frame in the circulation direction of the predetermined circulation path; and a power transmission for transmitting the driving force generated from the power source to the connection frame.

The test tray transferring apparatus further comprises a vertical transferring device for transferring the first gripping block and the second gripping block in a direction perpendicular to the predetermined circulation path.

The vertical transferring device comprises: a first vertical transfer for transferring the first gripping block in the direction perpendicular to the predetermined circulation path; and a second vertical transfer for transferring the second gripping block in the direction perpendicular to the predetermined circulation path independently from the first vertical transfer.

The first vertical transfer comprises: a first vertical transferring member coupled with the connection frame to move in the direction perpendicular to the predetermined circulation path and including a side with which the first gripping block is coupled to be actuated; and a first power source for providing a driving force to transfer the first vertical transferring member in the direction perpendicular to the predetermined circulation path; and the second vertical transfer comprises: a second vertical transferring member coupled with the connection frame to move in the direction perpendicular to the predetermined circulation path and including a side with which the second gripping block is coupled to be actuated; and a second power source for providing a driving force to transfer the second vertical transferring member in the direction perpendicular to the predetermined circulation path.

In order to achieve another aspect, there is provided a test tray transferring apparatus for a test handler comprising: a gripping block provided to move in a circulation direction of a predetermined circulation path and in a direction perpendicular to the predetermined circulation path while gripping or releasing a test tray to be circulated along the predetermined circulation path; a gripping block actuating device for actuating the gripping block to grip and release the test tray; a gripping block transferring device for transferring the gripping block in the circulation direction of the circulation path; and a vertical transferring device for transferring the gripping block in the direction perpendicular to the predetermined circulation path.

The gripping block transferring device comprises: a connection frame provided to move in the circulation direction of the predetermined circulation path; a first power source for providing a driving force required to transfer the connection frame in the circulation direction of the predetermined circulation path; and a power transmission for transmitting the driving force generated from the first power source to the connection frame; and the vertical transferring device comprises: a vertical transferring member coupled with the connection frame to move in the direction perpendicular to the predetermined circulation path and including a side with which the gripping block is coupled to be actuated; and a second power source for providing a driving force to transfer the vertical transferring member in the direction perpendicular to the predetermined circulation path.

In order to achieve still another aspect, there is provided a test handler comprising: a loading apparatus for loading semiconductor devices loaded in customer trays into a test tray at a loading position; a test chamber for assisting a test for the semiconductor devices loaded in the test tray that is completely loaded by the loading apparatus; an unloading apparatus for unloading the tested semiconductor devices loaded in the test tray, transferred to an unloading position via the test chamber to the customer trays; and a test tray transferring apparatus for transferring the test trays on a circulation path circulating the loading position, the test chamber and the unloading position; wherein the test tray transferring apparatus comprises: a gripping block provided to move in a circulation direction of a predetermined circulation path and in a direction perpendicular to the predetermined circulation path while gripping or releasing a test tray to be circulated along the predetermined circulation path; a gripping block actuating device for actuating the gripping block to grip and release the test tray; a gripping block transferring device for transferring the gripping block in the circulation direction of the circulation path; and a vertical transferring device for transferring the gripping block in the direction perpendicular to the predetermined circulation path.

In order to achieve the still another aspect, there is provided a method of transferring test trays for a test handler comprising: (a) gripping the test trays respectively by a first gripping block and a second gripping block; (b) transferring the respective test trays in a circulation direction by moving the first gripping block and the second gripping block in the circulation direction together; (b) releasing the test tray by the first gripping block; (d) transferring the test tray gripped by the second gripping block in the circulation direction by moving the first gripping block and the second gripping block in the circulation direction together; (d) releasing the test tray by the second gripping block; and (f) moving the first gripping block and the second gripping block in a direction reverse to the circulation direction together.

The step (c) comprises: moving the first gripping block backward; and elevating the first gripping block; and the step (e) comprises: moving the second gripping block backward; and elevating the second gripping block.

In order to achieve the still another aspect, there is provided a method of transferring test trays for a test handler comprising: (a) releasing a test tray by a first gripping block and gripping a test tray by a second gripping block; (b) transferring the test tray gripped by the second gripping block in a circulation direction by moving the first gripping block and the second gripping block in the circulation direction together; (c) releasing the test tray by the second gripping block; (d) moving the first gripping block and the second gripping block in a direction reverse to the circulation direction together; (e) gripping the test trays respectively by the first gripping block and the second gripping block; and (f) transferring the respective test trays in the circulation direction by moving the first gripping block and the second gripping block in the circulation direction together.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENTS

Hereinafter, preferred embodiments of the present invention will be described in detail with reference to the accompanying drawings, and duplicated description or description for obvious matter will be omitted or abridged if possible.

Figure 1:
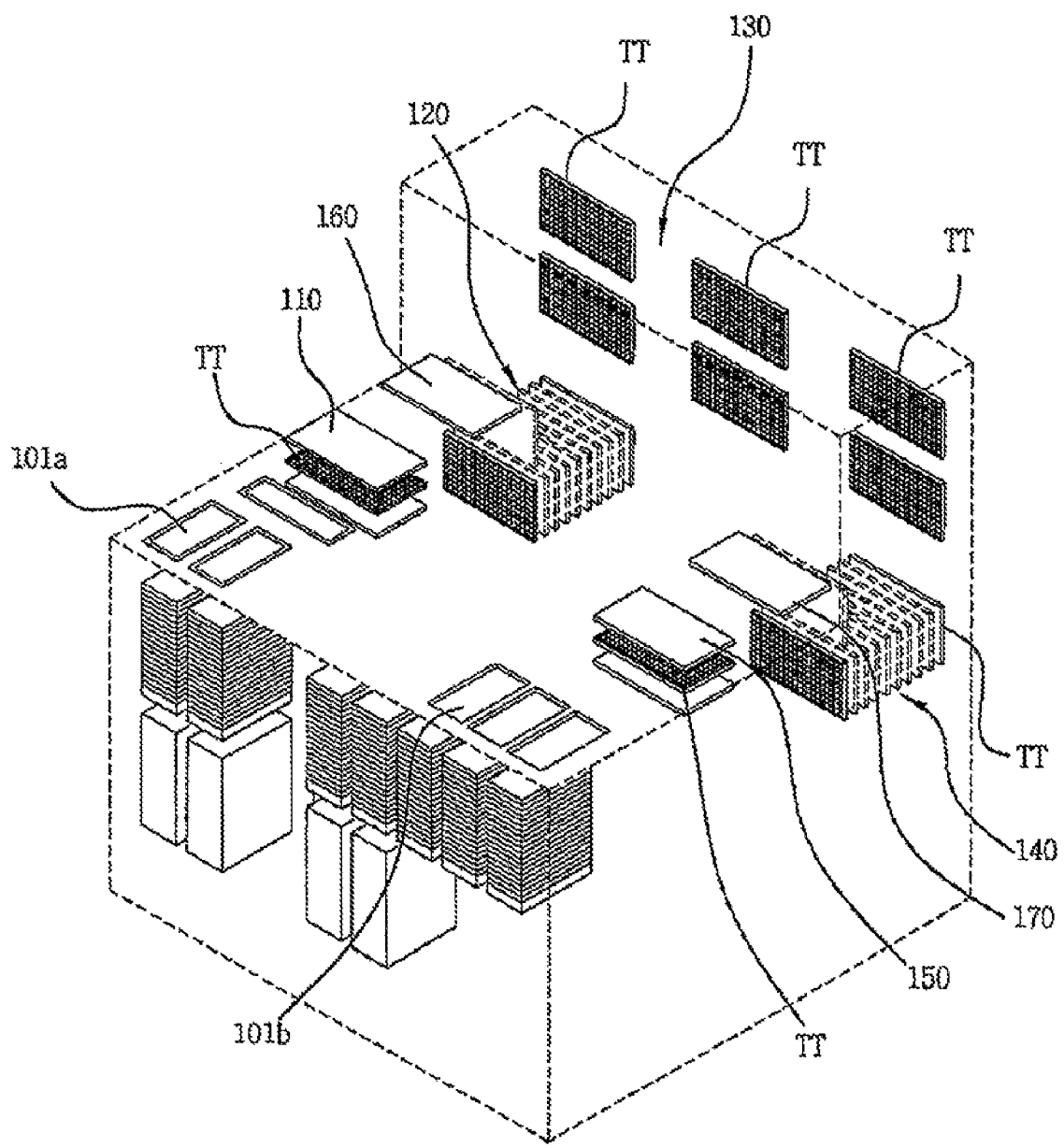
FIG. 1 is a schematic view schematically illustrating a conventional test handler.
Figure 2:
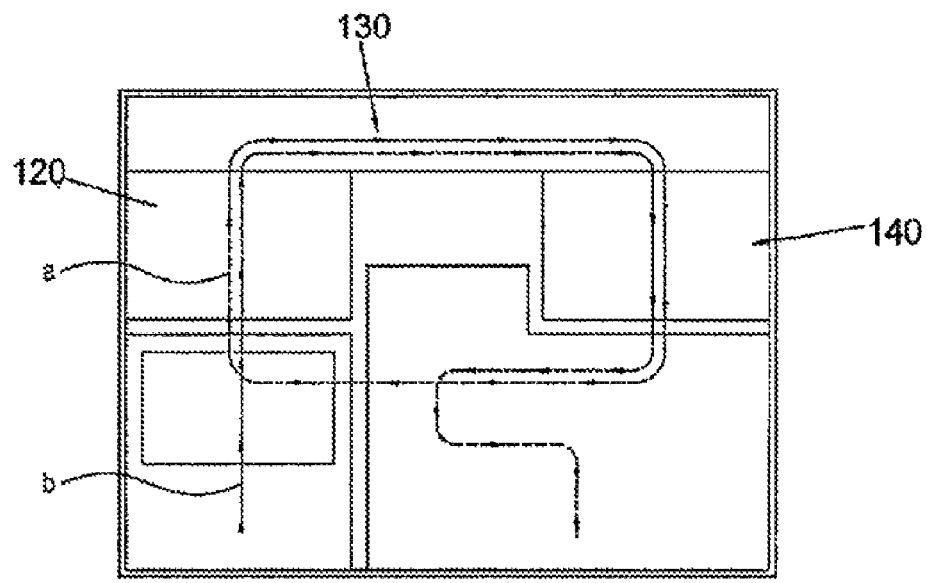
FIGS. 2 and 3 are conceptual plan views illustrating the test handler in FIG. 1.
Figure 3:
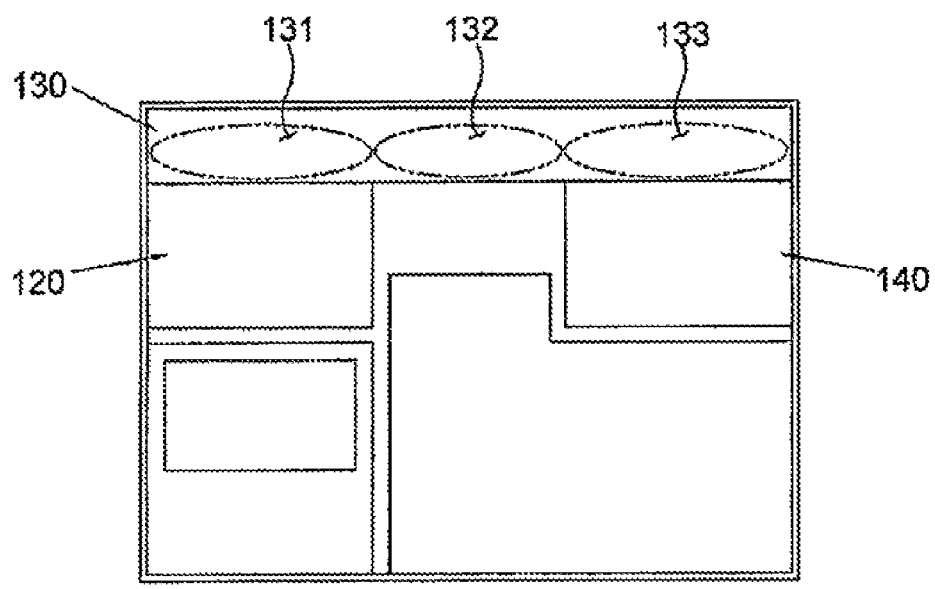
Figure 4:
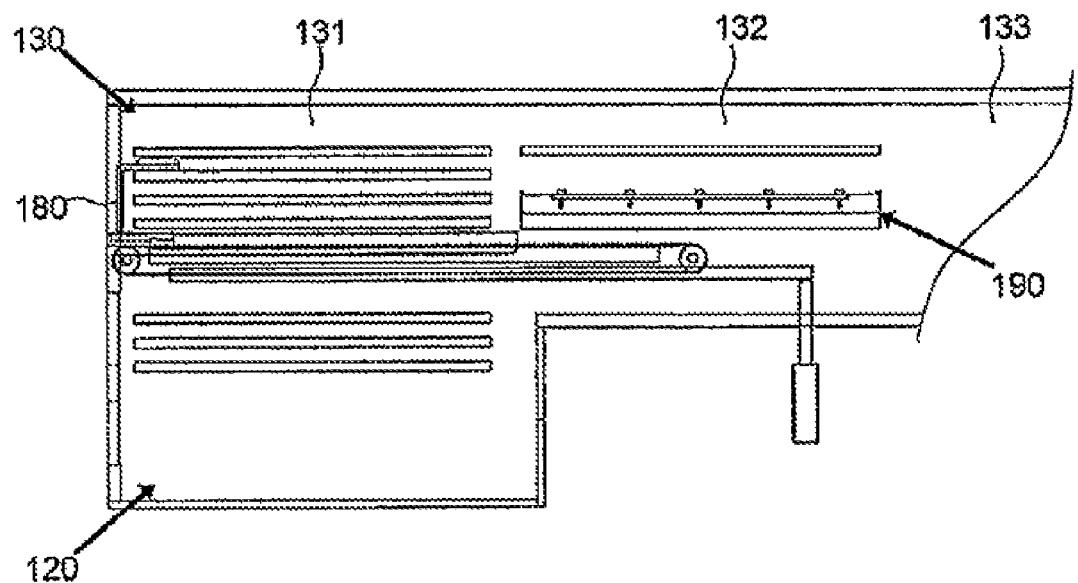
FIG. 4 is a plan view illustrating main parts of the conventional test handler.
Figure 5:
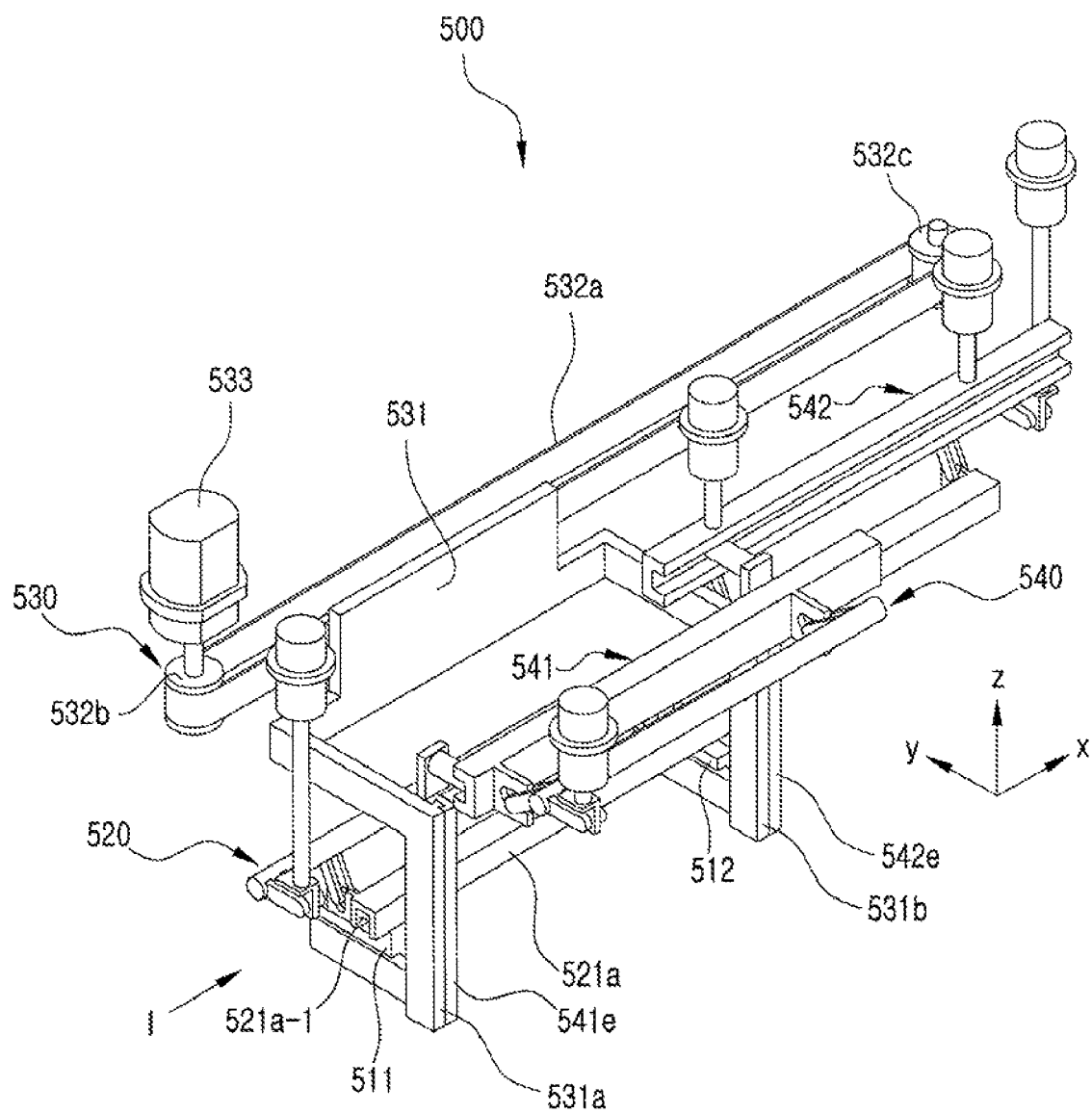
FIG. 5 is a perspective view illustrating a test tray transferring apparatus for a test handler according to an embodiment of the present invention.
Figure 6:
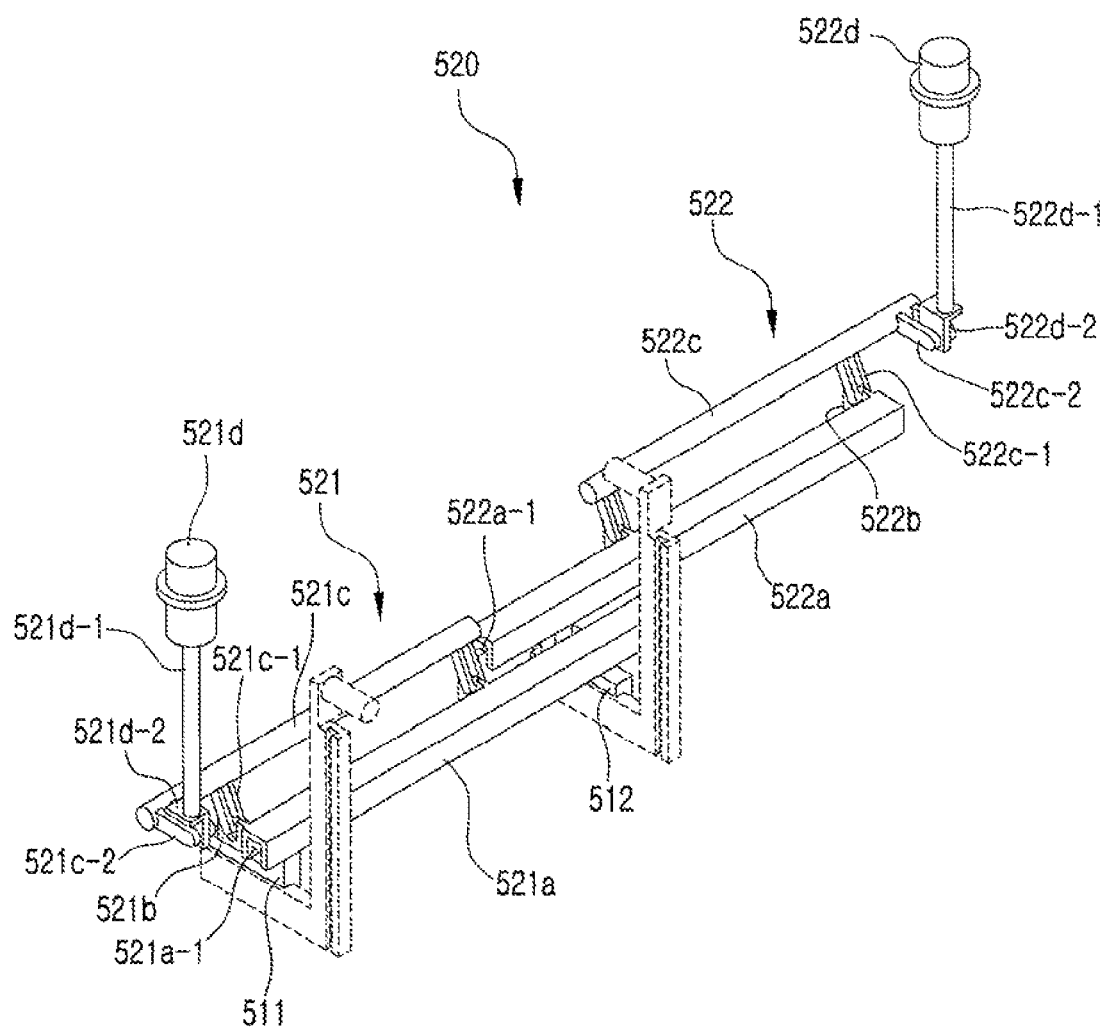
FIG. 6 is a partial perspective view illustrating a gripping block actuating device employed in the test tray transferring apparatus in FIG. 5.
Figure 7:
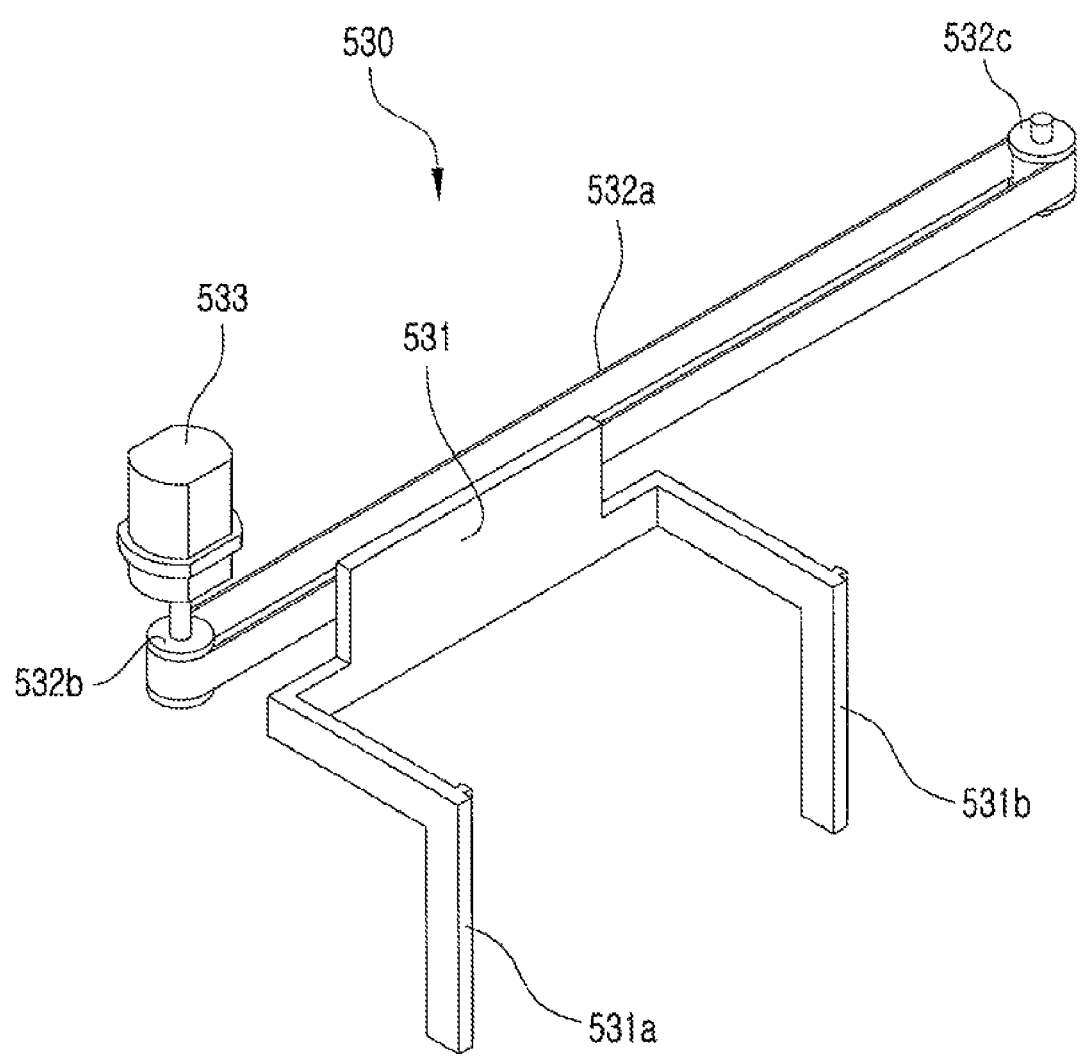
FIG. 7 is a partial perspective view illustrating a gripping block transferring device employed in the test tray transferring apparatus in FIG. 5.
Figure 8:
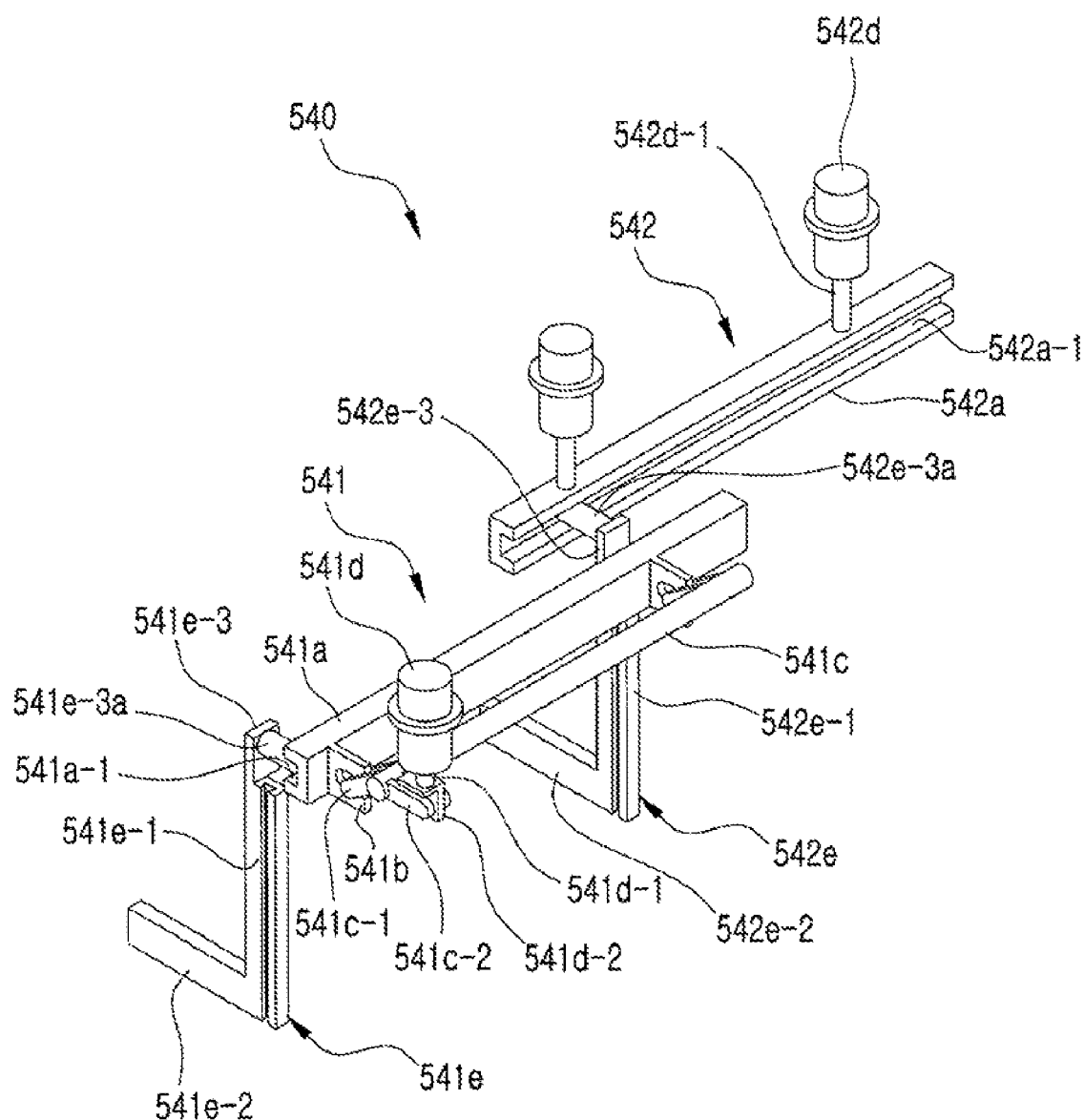
FIG. 8 is a partial perspective view illustrating a vertical transferring device employed in the test tray transferring apparatus in FIG. 5.

FIG. 5 is a perspective view illustrating a test tray transferring apparatus 500 according to an embodiment of the present invention. FIG. 6 is a perspective view illustrating only a gripping block actuating device 520 for actuating first and second gripping blocks 511 and 512 to grip or release test trays employed in the test tray transferring apparatus 500 in FIG. 5, FIG. 7 is a perspective view illustrating only a gripping block transferring device 530 for transferring the first and second gripping blocks 511 and 512 in a circulation direction on a circulation path employed in the test tray transferring apparatus 500 in FIG. 5, and FIG. 8 is a perspective view illustrating only a vertical transferring device 540 for transferring the first and second gripping blocks 511 and 512 in a direction (up-to-down direction) perpendicular to the circulation path employed in the test tray transferring apparatus 500 in FIG. 5.

Referring to FIG. 5, the test tray transferring apparatus 500 according to the embodiment of the present invention includes the first gripping block 511, the second gripping block 512, the gripping block actuating device 520, the gripping block transferring device 530, and the vertical transferring device 540.

Figure 9:
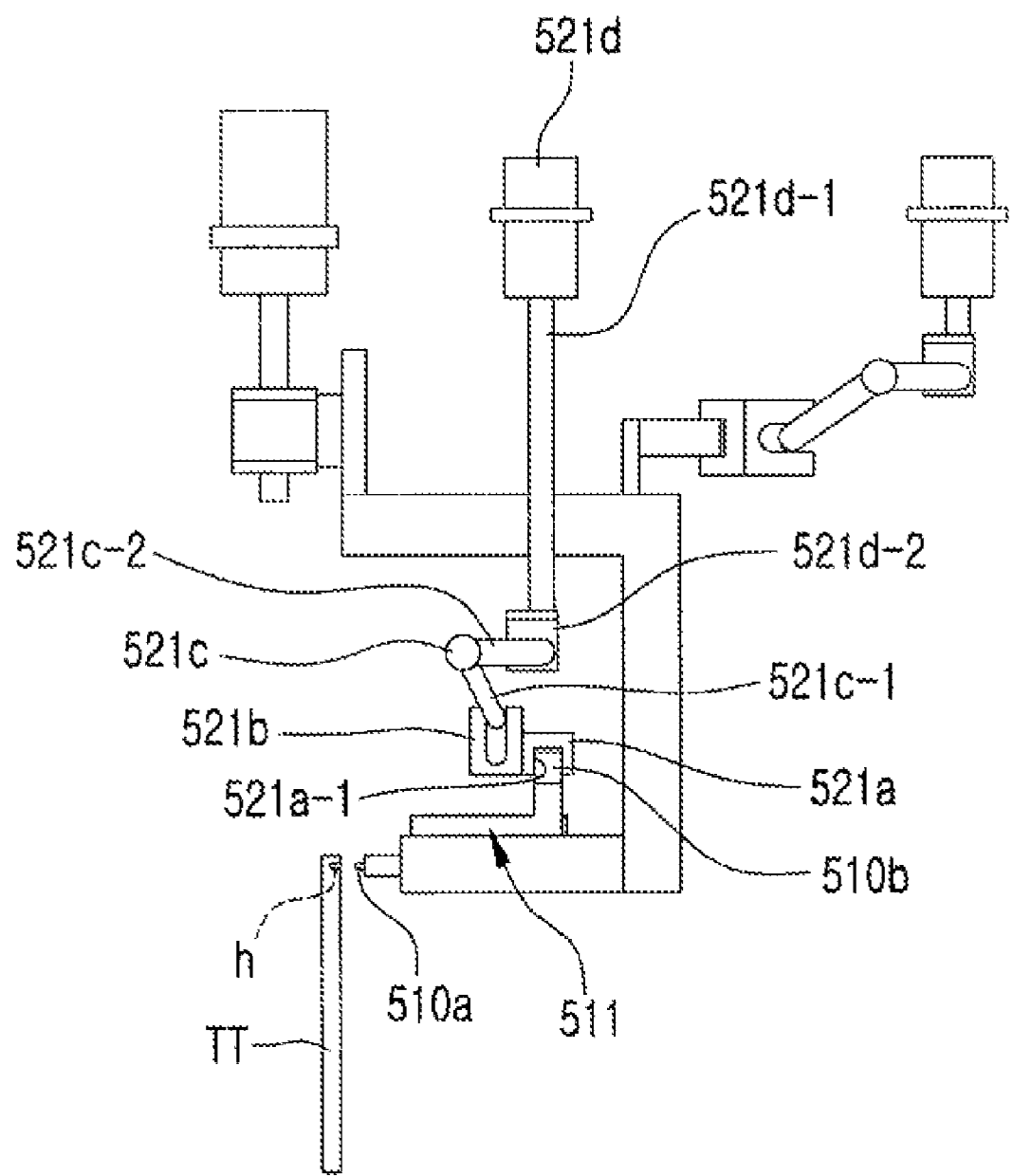
FIGS. 9 to 26 are reference views illustrating operation of the test tray transferring apparatus in FIG. 5.

The first gripping block 511 and the second gripping block 512 are provided to grip or to release test trays in a test stand-by unit and a test unit. In this embodiment, the first and second gripping blocks 511 and 512 are provided to slide forward and backward in a direction (Y-direction in FIG. 5, hereinafter referred to 'test tray direction') toward the test tray. The first gripping block 511, as illustrated in a side view of FIG. 9 showing the test tray transferring apparatus of FIG. 5 when viewing from I-direction, includes a gripping pin 510a for gripping and releasing the test trays during moving forward and backward in the test tray direction, and a sliding protrusion 510b inserted into a rail groove 521a-1 of a later-describing first forward and backward movement bar 521a to slide. The second gripping block 512 has the same structure as that of the first gripping block 511.

The gripping block actuating device 520, as illustrated in FIG. 6, includes a first gripping block actuator 521 and a second gripping block actuator 522.

The first gripping block actuator 521 is provided to move the first gripping block 511 forward and backward in the test tray direction, and includes the first forward and backward movement bar 521a, a first linkage 521b, a first swivel bar 521c, and a pneumatic cylinder 521d provided as a power source.

The first forward and backward movement bar 521a is provided in a longitudinal fashion along the circulation direction (X-direction in FIG. 5) of the test trays, and the rail groove 521a-1, into which the sliding protrusion 510b of the first gripping block 511 is inserted, is formed in the longitudinal fashion along the circulation direction.

The first linkage 521b is fixed to (or integrated with) the first forward and backward movement bar 521a and converts the rotation force of the first swivel bar 521c into a forward and backward force of the first forward and backward movement bar 521a.

The first swivel bar 521c is disposed in a longitudinal fashion along the circulation direction so as to swivel. The first swivel bar 521c is formed with a first linkage coupling protrusion 521c-1 to be linked to the first linkage 521b and a first cylinder coupling protrusion 521c-2 formed in an end of the first swivel bar 521c to be coupled with the pneumatic cylinder 521d.

The pneumatic cylinder 521d has a first coupling piece 521d-2 to be linked with the first cylinder coupling protrusion 521c-2 formed in an end of a cylinder rod 521d-1.

Figure 10:
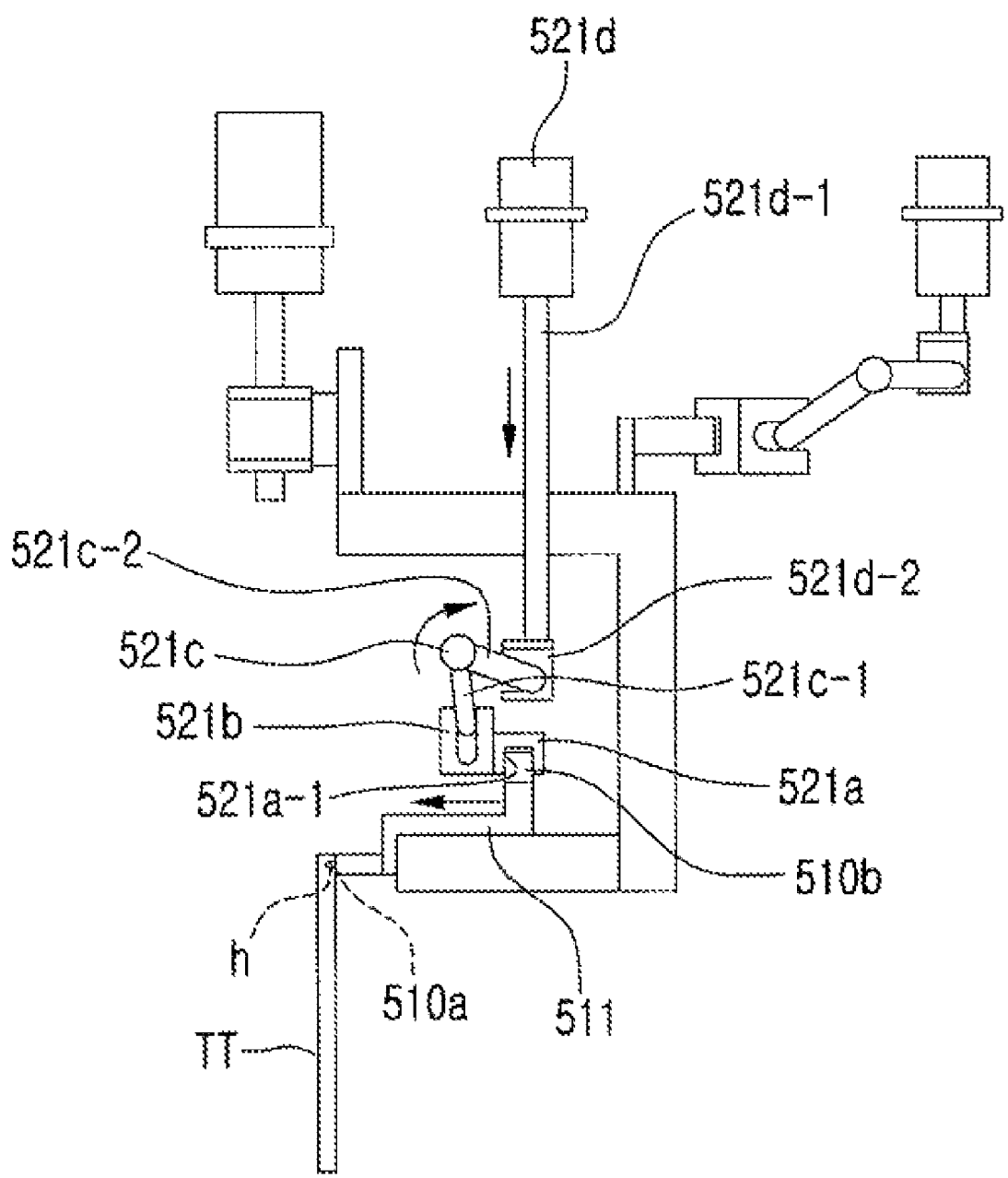

The first gripping block actuator 521 will be described with reference to side views of FIGS. 9 and 10. FIG. 9 illustrates a status before the first gripping block 511 grips the test tray TT, and when the pneumatic cylinder 521d is actuated in the status as illustrated in FIG. 9, the first swivel bar 521c, which is connected to a piston rod 521d-1 of the pneumatic cylinder 521d by the first cylinder coupling protrusion 521c-2, swivels in the direction depicted by an arrow in FIG. 10 and the first forward and backward movement bar 521a, connected to the first swivel bar 521c by the first linkage 521b, and the first gripping block 511, connected to the first forward and backward movement bar 521a, move toward the test tray TT as illustrated in FIG. 10, so that the gripping pin 510a of the first gripping block 511 is inserted into a gripping hole 'h' formed in the test tray TT. When the pneumatic cylinder 521d is reversely actuated, the gripping pin 510a of the first gripping block 511 is withdrawn from the gripping hole 'h' of the test tray TT in the reverse order. Since configuration and operation of the first gripping block actuator 521 are described in detail with respect to the related art, a further description thereof will be omitted.

As illustrated in FIG. 6, the second gripping block actuator 522 is provided to move the second gripping block 512 forward and backward in the test tray direction, and includes a second forward and backward movement bar 522a, a second linkage 522b, a second swivel bar 522c, and a pneumatic cylinder 522d provided as a power source.

The second forward and backward movement bar 522a is provided in a longitudinal fashion along the circulation direction (X-direction in FIG. 5), and a rail groove 522a-1, into which a sliding protrusion (not shown in the drawing because of being inserted) of the second gripping block 512 is inserted, is formed in the longitudinal fashion along the circulation direction.

The second linkage 522b is fixed to the second forward and backward movement bar 522a and converts the rotation force of the second swivel bar 522c into a forward and backward force of the second forward and backward movement bar 522a.

The second swivel bar 522c is disposed in a longitudinal fashion along the circulation direction so as to swivel. The second swivel bar 521c is formed with a second linkage coupling protrusion 522c-1 to be linked to the second linkage 522b and a second cylinder coupling protrusion 522c-2 formed in an end of the second swivel bar 522c to be coupled with the pneumatic cylinder 522d.

The pneumatic cylinder 522d has a second coupling piece 522d-2 to be linked with the second cylinder coupling protrusion 522c-2 formed in an end of a cylinder rod 522d-1.

As described above, the first gripping block actuator 521 and the second gripping block actuator 522 have identical structure and operative principles thereof are the same. However, since the pneumatic cylinders 521d and 522d may be independently actuated, the first gripping block 511 and the second gripping block 512 are configured to independently perform the gripping and releasing.

The gripping block transferring device 530, as illustrated in FIGS. 5 and 7, includes a connection frame 531, a power transmission comprising a belt 532a, a driving pulley 532b, and a driven pulley 532c, and a reversible motor 533 provided as a power source.

As illustrated in FIG. 7, the connection frame 531 has a first connection bar 531a and a second connection bar 531b having L-shape downwardly extended from both ends of the connection frame 531 by a distance, and has an upper side fixed by the belt 532a. As illustrated in FIG. 5, the first connection bar 531a is finally coupled with the first gripping block 511 and the second connection bar 531b is finally coupled with the second gripping block 512. The coupling relationship between the first and second connection bars 531a and 531b and the first and second gripping blocks 511 and 512 will be described later.

The belt 532a is provided to rotate about the driving pulley 532b and the driven pulley 532c and the reversible motor 533 supplies a rotation force to the driving pulley 532b resulting in providing the rotation force to the belt 532a.

According to the gripping block transferring device 530, the driving pulley 532b rotates when the reversible motor 533 is driven and due to this the belt 532a rotates so that the connection frame 531 can move in the circulation direction. Thus, the first and second gripping blocks 511 and 512 respectively coupled with the first and second connection bars 531a and 531b of the connection frame 531 can also move in the circulation direction in association with the rotation of the belt 532a.

Continuously, the vertical transferring device 540 will be described with reference to FIGS. 5 and 8.

The vertical transferring device 540 transfers the first and second gripping blocks 511 and 512 in the direction (Z-direction in FIG. 5, hereinafter referred to 'up-to-down direction') perpendicular to the circulation path, and includes a first vertical transfer 541 and a second vertical transfer 542.

The first vertical transfer 541 is provided to transfer the first gripping block 511 in the up-to-down direction, and includes a first elevation bar 541a, a third linkage 541b, a third swivel bar 541c, a pneumatic cylinder 541d provided as a power source and a first vertical transferring member 541e.

The first elevation bar 541a is provided in a longitudinal fashion along the circulation direction (X-direction in FIG. 5), and a rail groove 541a-1, into which a sliding protrusion 541e-3a of the first vertical transferring member 541e is inserted, is formed along the longitudinal fashion in the circulation direction.

The third linkage 541b is fixed to (or integrated with) the first elevation bar 541a and converts the rotation force of the third swivel bar 541c into an elevation force of the first elevation bar 541a.

The third swivel bar 541c is disposed in a longitudinal fashion along the circulation direction so as to swivel. The third swivel bar 541c is formed with a third linkage coupling protrusion 541c-1 to be linked to the third linkage 541b and a third cylinder coupling protrusion 541c-2 formed in an end of the third swivel bar 541c to be coupled with the pneumatic cylinder 541d.

The pneumatic cylinder 541d has a third coupling piece 541d-2 to be linked with the third cylinder coupling protrusion 541c-2 formed in an end of a cylinder rod 541d-1.

The first vertical transferring member 541e has an L-shape, and for the convenience description, a portion extended in the up-to-down direction is defined as a vertical bar 541e-1 and a portion extended in the lateral direction is defined as a horizontal bar 541e-2. On the top of the vertical bar 541e-1, there is provided a first sliding member 541e-3 formed with a sliding protrusion 541e-3a which is inserted into the rail groove 541a-1 of the first elevation bar 541a. As illustrated in FIG. 5, the first gripping block 511 is coupled with the horizontal bar 541e-2 to slide in the test tray direction and the vertical bar 541e-1, as illustrated in FIG. 5, is coupled with the first connection bar 531a of the connection frame 531 to slide up and down. For reference, since the first gripping block 511 is coupled with the horizontal bar 541e-2 of the first vertical transferring member 541e to slide in the test tray direction and the vertical bar 541e-1 of the first vertical transferring member 541e is coupled with the first connection bar 531a to slide up and down, the first gripping block 511 is coupled with the first connection bar 531a of the connection frame 531 so that the transferring in the circulation direction can be associated and this mechanical configuration is identical to the coupling relationship between the second connection bar 531b of the connection frame 531 and the second gripping block 512.

Figure 11:
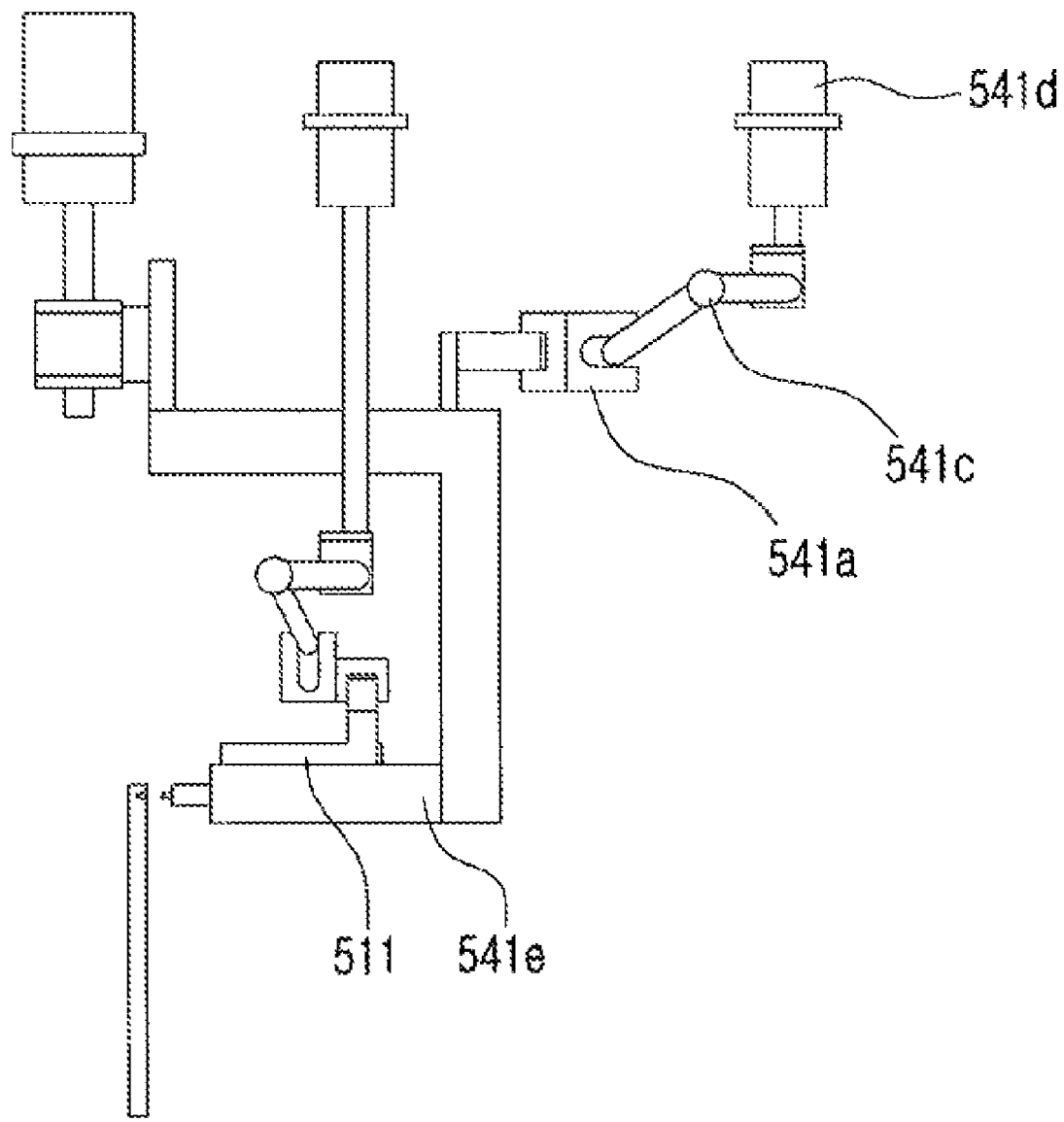
Figure 12:
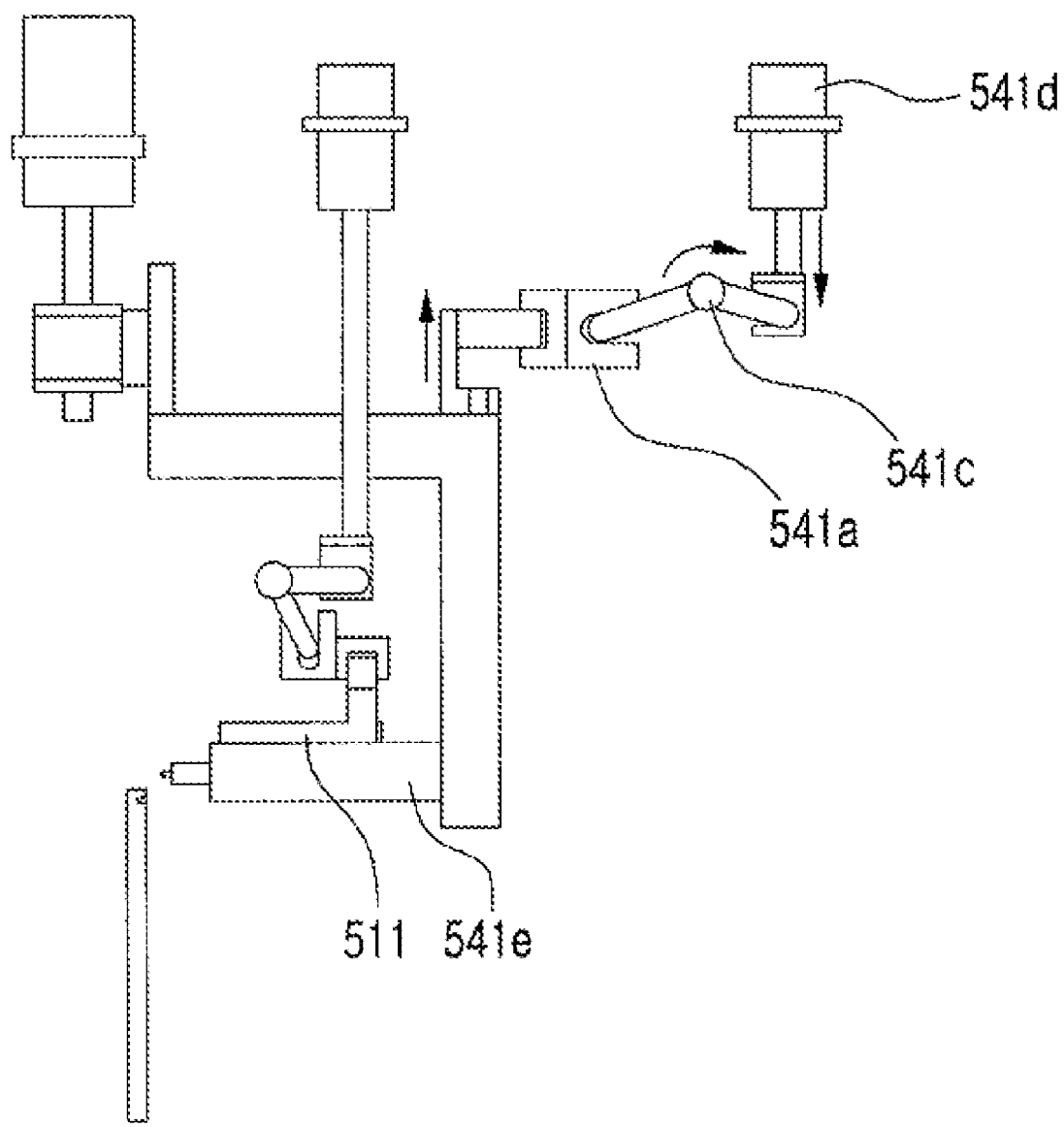

Operation of the first vertical transfer 541 will be described with reference to FIGS. 11 and 12. When the pneumatic cylinder 541d is actuated in the status as illustrated in FIG. 11, the third swivel bar 541c swivels in an arrow direction in FIG. 12 and the first elevation bar 541a is elevated due to the swivel of the third swivel bar 541c. The elevation of the first elevation bar 541a makes the first vertical transferring member 541e be elevated so that the first gripping block 511 is elevated. Needless to say, when the pneumatic cylinder 541d is reversely actuated, the first gripping block 511 is lowered in the reverse order.

As illustrated in FIGS. 5 and 8, the second vertical transfer 542 is provided to transfer the second gripping block 512 in the up-to-down direction, is driven independently from the first vertical transfer 541, and includes a second elevation bar 542a, a pneumatic cylinders 542d provided as power sources, and the second vertical transferring member 542e.

The second elevation bar 542*a* is provided in a longitudinal fashion along the circulation direction (X-direction in FIG. 5), and a rail groove 542*a*-1, into which a sliding protrusion 542*e*-3*a* of the second vertical transferring member 542*e* is inserted, is formed in the longitudinal fashion along the circulation direction.

The pneumatic cylinders 542*d* have ends of piston rods 542*d*-1 connected to the second elevation bar 542*a*.

The second vertical transferring member 542*e* has the same L-shape as that of the first vertical transferring member 541*e*. Identically, on the top of the vertical bar 542*e*-1, there is provided a second sliding member 542*e*-3 formed with a sliding protrusion 542*e*-3*a* which is inserted into the rail groove 542*a*-1 of the second elevation bar 542*a*, and the second gripping block 512 is coupled with the horizontal bar 542*e*-2 to slide in the test tray direction. The vertical bar 542*e*-1, as illustrated in FIG. 5, is coupled with the second connection bar 531*b* to slide up and down.

Thus, when the pneumatic cylinders 542*d* are actuated, the second vertical transferring member 542*e* is elevated so that the second gripping block can be elevated.

Although, in this embodiment, there is a difference between configurations of the first vertical transfer 541 and the second vertical transfer 542, it is possible to implement the first and second vertical transfers in the same configuration according to circumstances. These configurations may be selectively employed by considering interference with other devices during design. This is all the same in the first and second gripping block actuators. Moreover, since both the pneumatic cylinders 541*d* and 542*d* may be independently actuated, the first gripping block 511 and the second gripping block 512 are designed to be independently elevated and lowered.

Overall operation of the test tray transferring apparatus 500 according to the embodiment of the present invention will be described with reference to FIG. 13 to FIG. 26.

Figure 13:
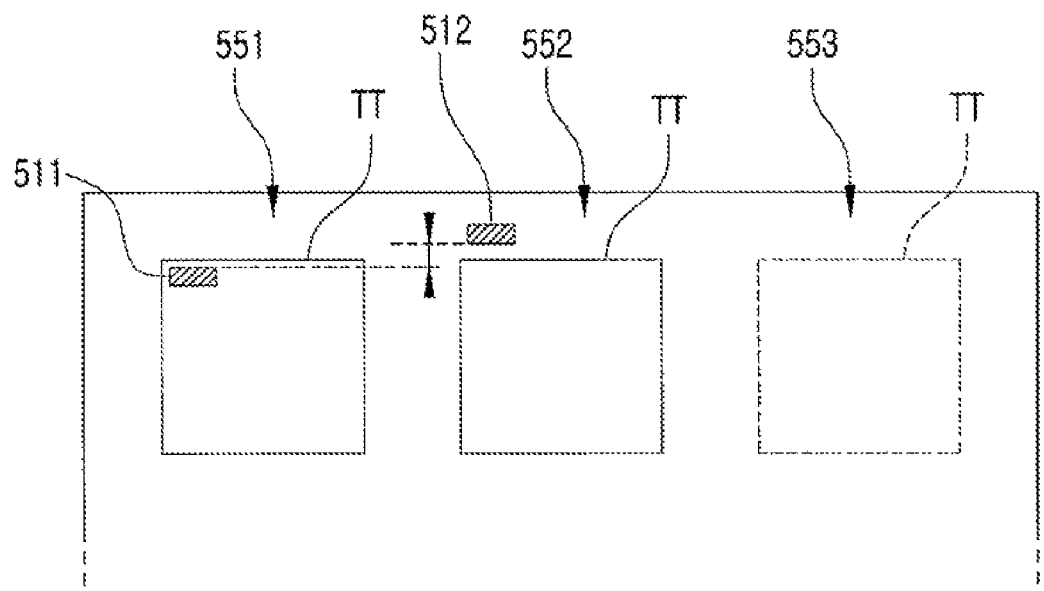

FIG. 13 conceptually illustrates positions of the first and second gripping blocks 511 and 512 when the semiconductor devices currently loaded in the test trays TT in the test unit 552 are tested. In FIG. 13, the test trays TT depicted by solid lines in the test stand-by unit 551 and the test unit 552 means that the current test trays TT are positioned at corresponding positions, and the test tray TT depicted by a dotted line in the output stand-by unit 553 means that the current test tray TT is empty at a corresponding position (hereinafter, the test trays are depicted in the same manner.)

As illustrated in FIG. 13, the second gripping block 512 maintains the elevated status and this is to prevent the interference with a pushing unit (not shown).

Figure 14:
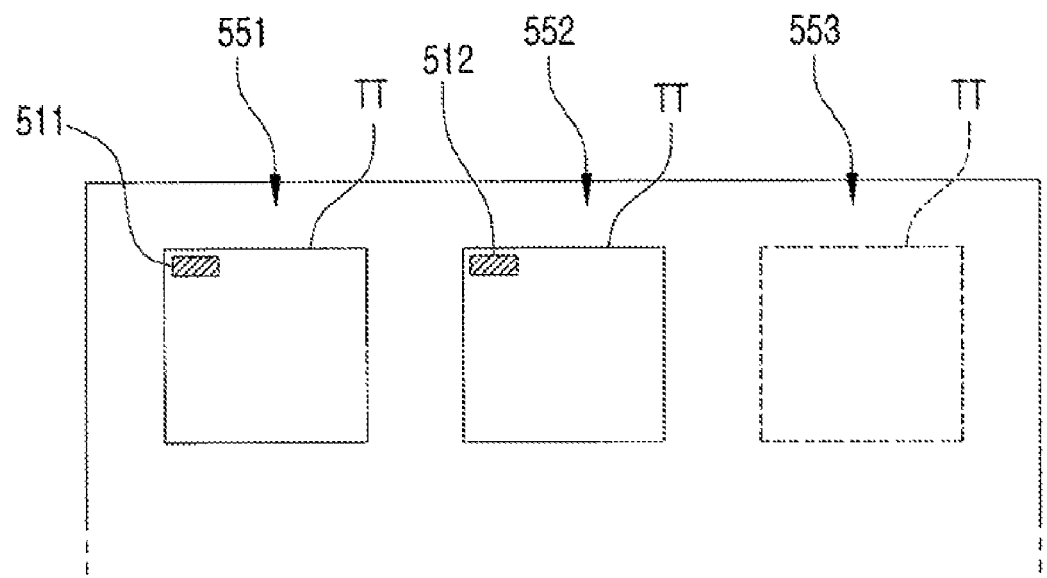

In the status as illustrated in FIG. 13, when the semiconductor devices loaded in the test trays TT in the test unit 552 are completely tested, the second vertical transfer 542 is actuated such that the second gripping block 512 is lowered to the same level as that of the first gripping block 511 and the status as illustrated in FIG. 14 is achieved.

Figure 15:
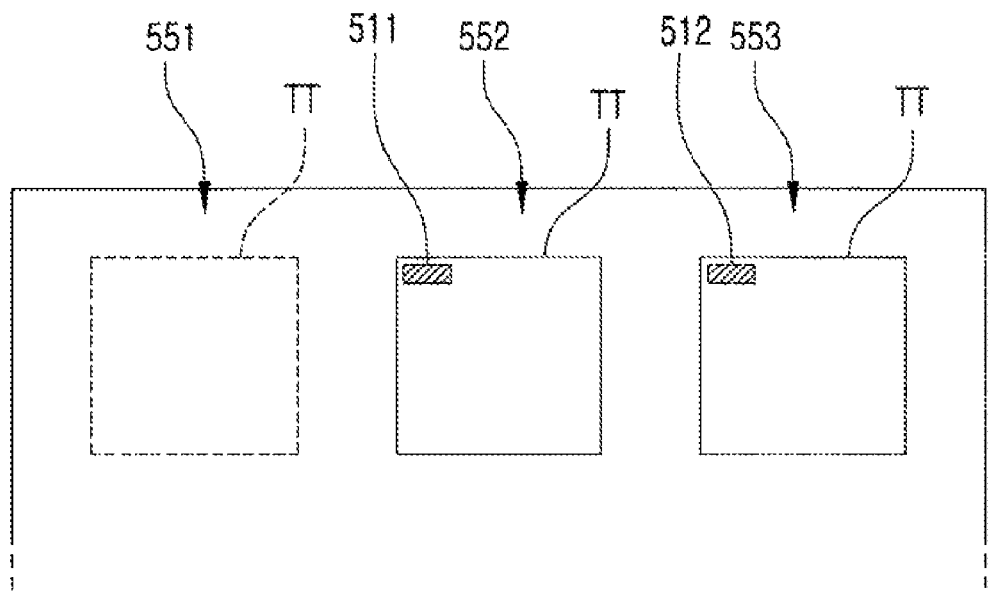

Continuously, the first gripping block actuator 521 and the second gripping block actuator 522 are actuated such that the first gripping block 511 and the second gripping block 512 move forward in the test tray direction to respectively grip the test trays TT, and the gripping block transferring device 530 is driven to transfer the first gripping block 511 and the second gripping block 512 in the circulation direction so that the front and rear test trays TT on the circulation path are transferred in the circulation direction as illustrated in FIG. 15. In other words, the test tray TT in the test stand-by unit 551 is transferred to the test unit 552 and the test tray TT in the test unit 552 is transferred to the output stand-by unit 553.

Figure 16:
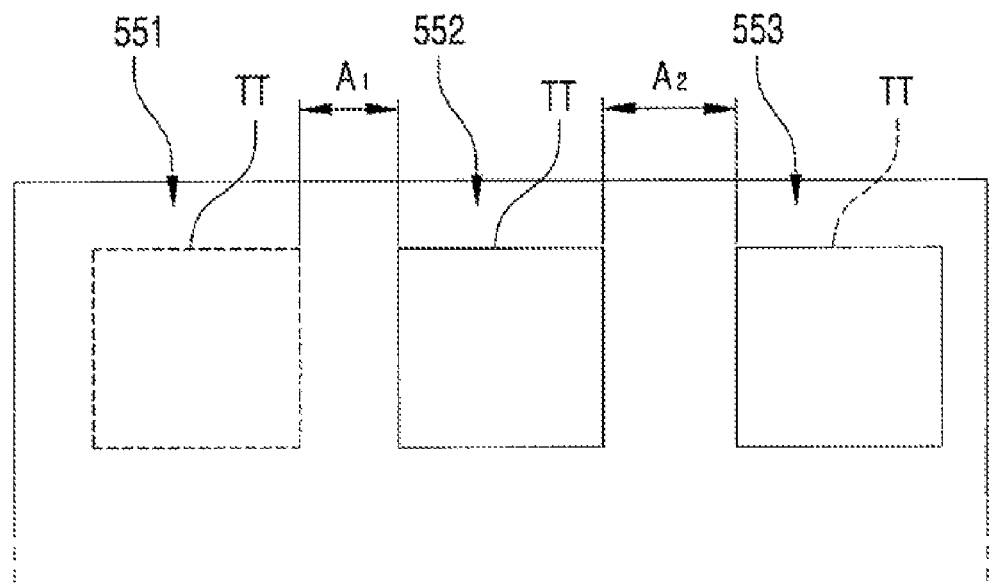
Figure 17:
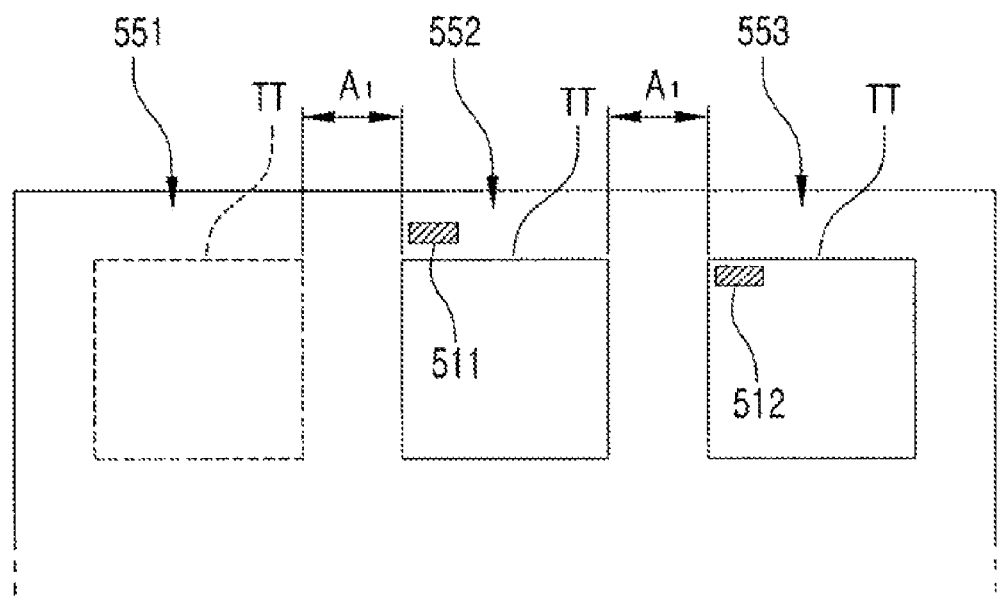
Figure 18:
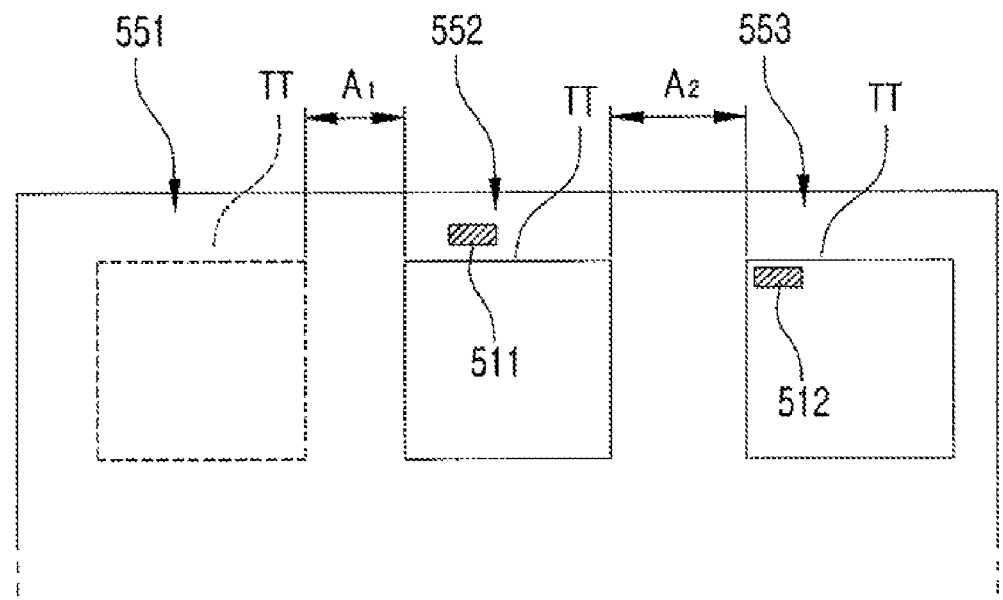

Meanwhile, as illustrated in FIG. 16, in a case of a general test handler, a distance $A_1$ between the test trays TT respectively positioned in the test stand-by unit 551 and the test unit 552 may be different from a distance $A_2$ between the test trays TT respectively positioned in the test unit 552 and the output stand-by unit 553. Usually, the latter $A_2$ is greater than the former $A_1$, and in this case the trays TT in the test unit 552 cannot be transferred to desired positions in the output stand-by unit 553 only by the operation as illustrated in FIG. 15. Thus, in this case, the first gripping block actuator 521 is actuated in the status of FIG. 15 to move the first gripping block 511 backward and to release the test tray TT, then the first vertical transfer 541 is driven to be elevated upward so that the first and second gripping blocks 511 and 512 reach the positions as illustrated in FIG. 17. And, as illustrated in FIG. 18, the gripping block transferring device 530 actuates further to transfer the test tray TT being transferred from the test unit 552 to the output stand-by unit 553 to a desired position in the output stand-by unit 553. For reference, in the position as illustrated in FIG. 17, it is possible for the pushing unit (not shown) to be actuated so as to push the test tray TT transferred to the test unit 552 toward the tester (not shown) so that the test can be carried out.

Figure 19:
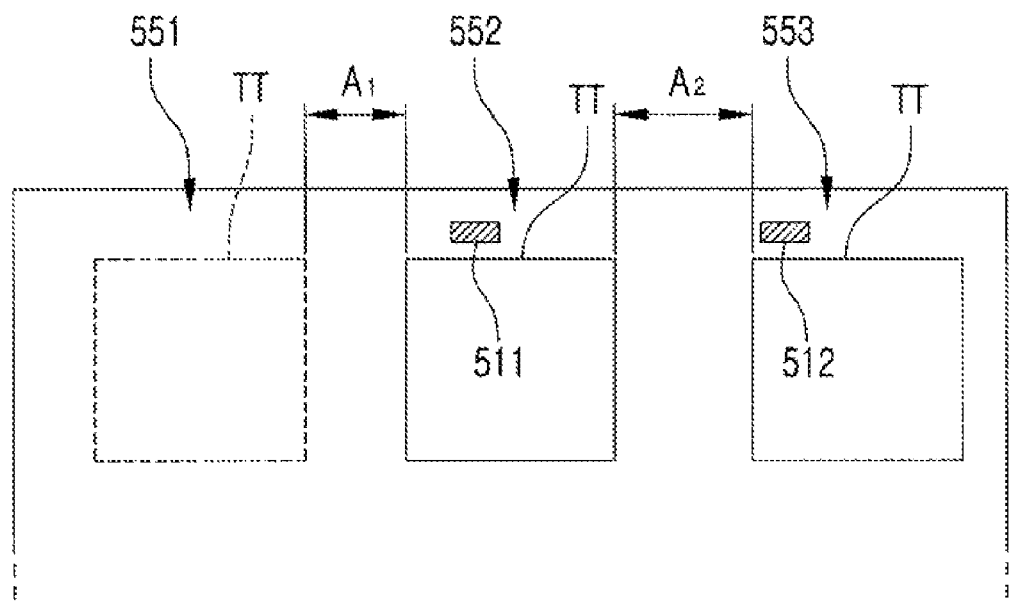
Figure 20:
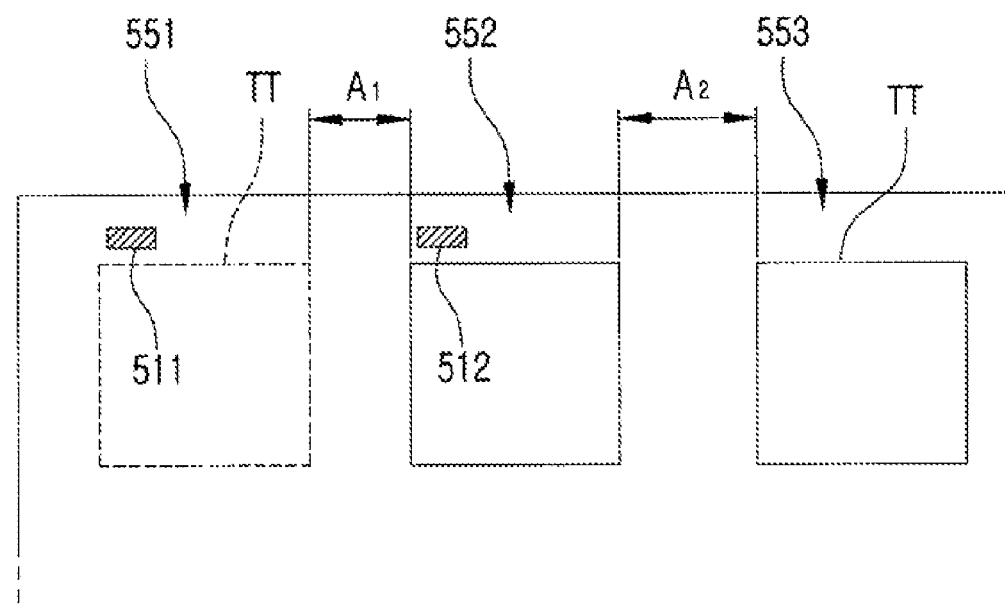

Meanwhile, in the status of FIG. 18, in order for the first gripping block 511 and the second gripping block 512 to be positioned at initial positions, that is, in the status as illustrated in FIG. 13, the second gripping block actuator 522 is actuated to move the second gripping block 512 backward and to release the test tray TT, and the second vertical transfer 542 is driven to elevate the second gripping block 512 upwardly so that the status as illustrated in FIG. 19 is achieved. Then, the gripping block transferring device 520 is reversely driven such that the first and second gripping blocks 511 and 512 reach the positions as illustrated in FIG. 20, and the vertical transferring device 540 is driven such that the first and second gripping blocks 511 and 512 reach the positions as illustrated in FIG. 13 and waits for when a current test in the test unit 552 is finished.

For reference, since the operation that the second gripping block 512 transfers the test tray TT to a desired position in the output stand-by unit 553 and the operation that the first and second gripping blocks 511 and 512 are transferred to the initial positions as illustrated in FIG. 13 may be performed without interference with the operation of the pushing unit (due to the vertical transferring of the first and second gripping blocks), the test of the semiconductor devices loaded in the test trays TT positioned in the test unit 552 can be carried out more earlier.

Figure 21:
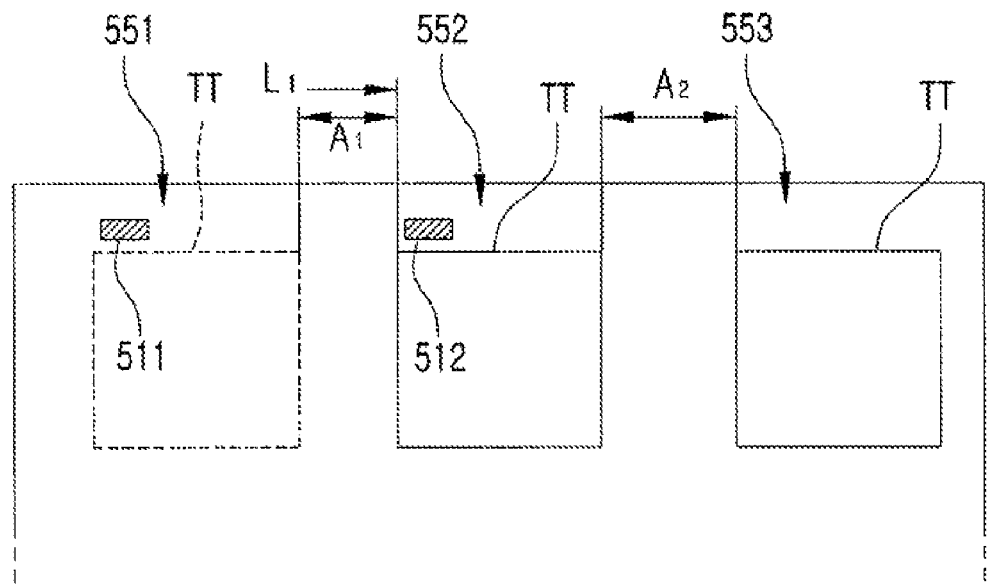
Figure 22:
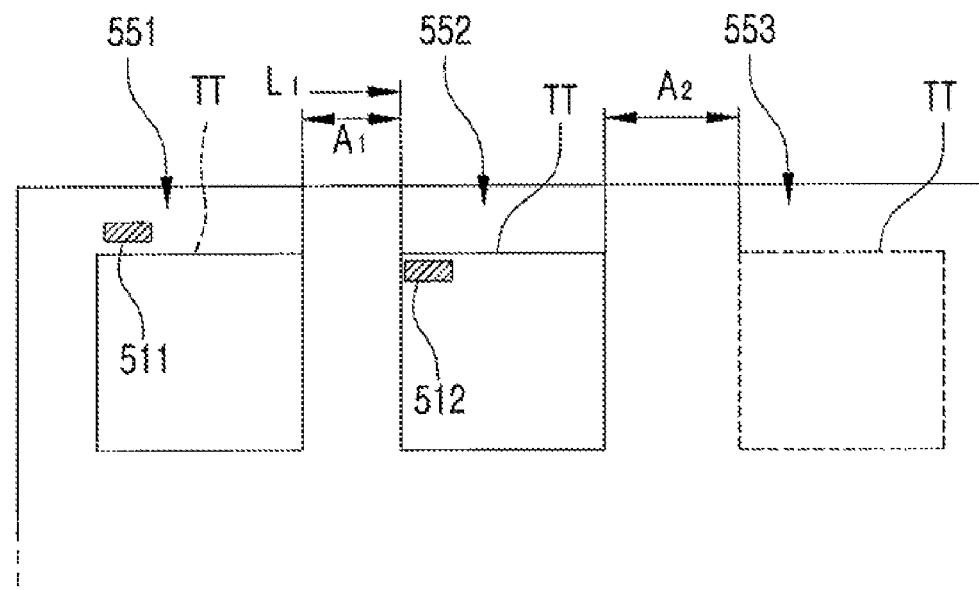
Figure 23:
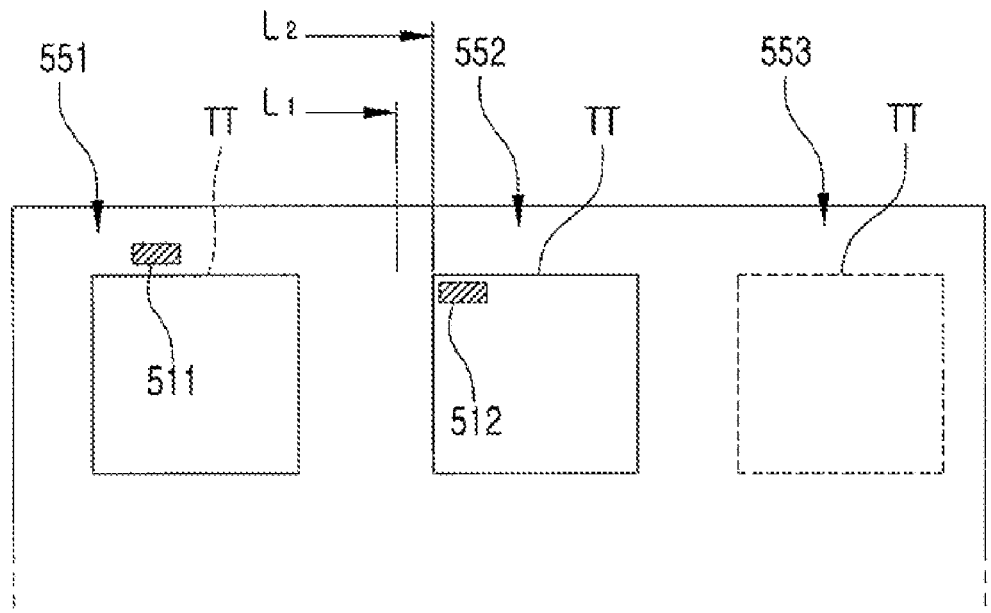
Figure 24:
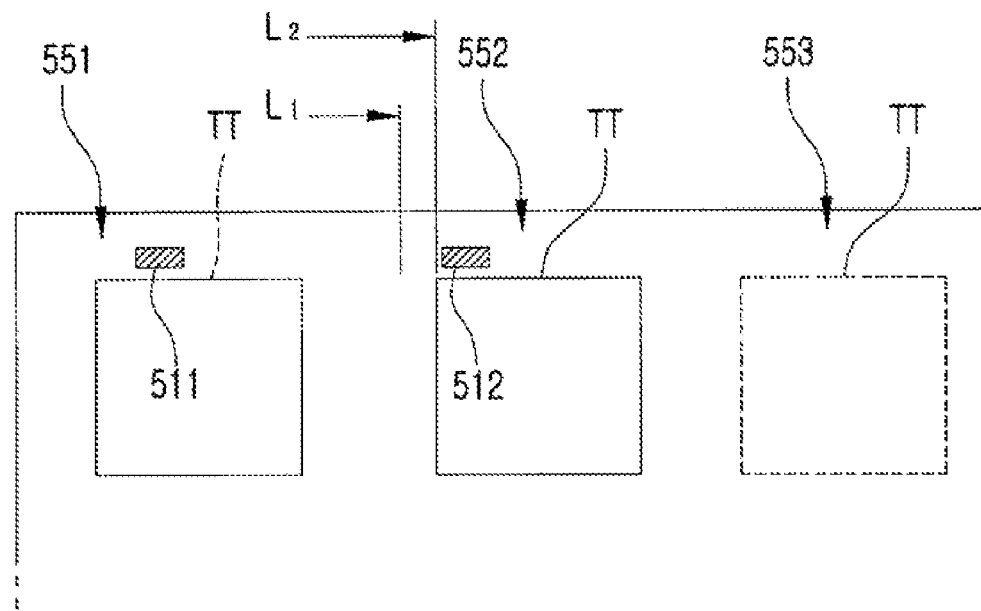
Figure 25:
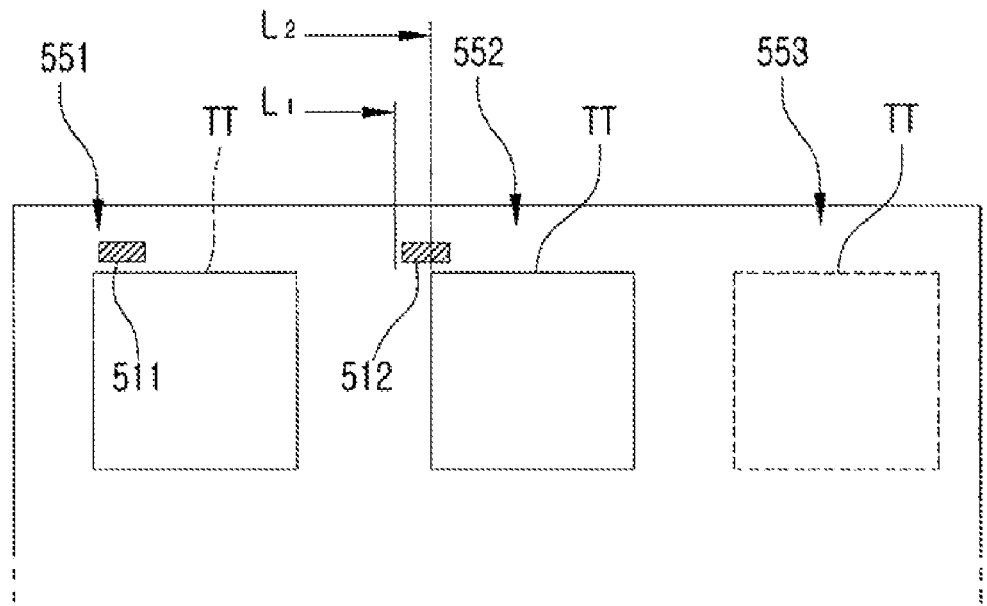
Figure 26:
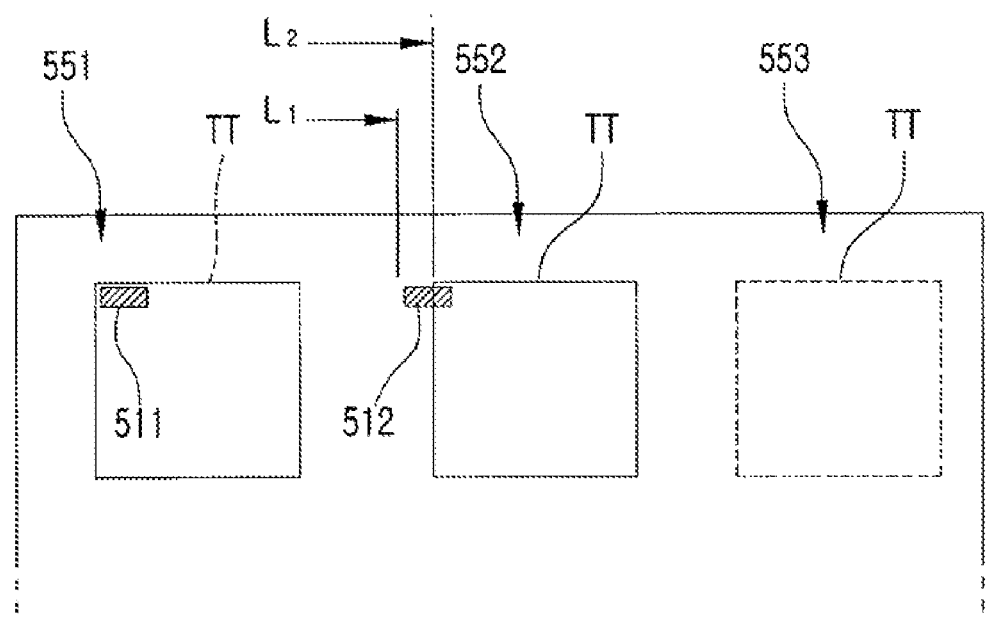

Meanwhile, the semiconductor devices loaded in the test trays TT positioned in the test unit 552 may be tested over two steps. For example, a method is carried out of assisting a test for semiconductor devices of even rows (or odd rows) of test trays first and then of assisting a test of semiconductor devices of odd rows (or even rows) of the test trays by slightly transferring the test trays TT in the circulation direction of the circulation path. In this case, the test transferring apparatus 500 transfers the test trays TT to $L_1$ which is the proper position for the test of the even rows of the test trays TT by the above-mentioned operation and returns to the initial position to make the status as illustrated in FIG. 21. After the completion of the test for the even rows of the test trays TT, the second vertical transfer 542 and the second gripping block actuator 522 are sequentially driven such that the second gripping block 512, as illustrated in FIG. 22, grips the test trays TT in the test unit 552. For reference, at this time, in the output stand-by unit 553 the test trays TT are already outputted to the de-soak chamber and in the test stand-by unit 551 the test trays TT may be positioned or not. In the status of FIG. 22, the gripping block transferring device 530 is driven to transfer the test trays TT to the position $L_2$ suitable for the test of the even rows of the test trays TT as illustrated in FIG. 23. After the second gripping block actuator 522 and the second vertical transfer 542 are sequentially driven to reach the status as illustrated in FIG. 24, the test for the odd rows of the test trays TT is assisted and the status as illustrated in FIG. 25 is achieved by the operation of the gripping block transferring device 530. After the completion of the test for the odd rows of the test trays TT, the first and second vertical transfers 541 and 542 and the first and second gripping block actuators 521 and 522 are actuated, as illustrated in FIG. 26, to grip the test trays TT in the test stand-by unit 551 and the test unit 552 again and the following operation is carried out.

Moreover, the test tray transferring apparatus 500 of the present invention is configured to grip or release the test trays TT using a linear movement of the first and the second gripping blocks 511 and 512 by employing the mechanical configuration according to the related art for the gripping and releasing of the test trays TT, but may be applied to a case of gripping the test trays when rotating in a certain direction and of releasing the test trays when rotating reversely by using the gripping blocks rotated with the swivel bars of the gripping block actuators.

As described above, the test tray transferring apparatus of the present invention has the following advantages.

Two front and rear test trays on the circulation path are transferred together in the state of being separated by a distance, so that collision between the test trays can be prevented and the test trays and the semiconductor devices loaded therein can be also prevented from being damaged.

Moreover, the first gripping block and the second gripping block for the respective front and rear test trays on the circulation path are transferred by a single gripping block transferring device, in more detail, by a single power source so that the number of expensive motors to be employed can be minimized, and the first and second gripping blocks can grip and be elevated independently from each other so that the flow of the test trays can be faster.

Furthermore, since the gripping blocks are transferred in the direction perpendicular to the circulation path, interference between the operation of the pushing unit and the operation of the test tray transferring apparatus can be minimized, resulting in advancing the test starting point for the semiconductor devices loaded in the test trays of the test unit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A test tray transferring apparatus for a test handler comprising:
    a first gripping block provided to move in a circulation direction of a predetermined circulation path while gripping or releasing a front test tray of two test trays to be circulated along the predetermined circulation path;
    a second gripping block spaced apart from the first gripping block and provided to move in the circulation direction of the predetermined circulation path while gripping or releasing a rear test tray of the two test trays;
    a gripping block actuating device for actuating the first gripping block and the second gripping block to grip and release the two test trays;
    a gripping block transferring device for transferring the first gripping block and the second gripping block together along the circulation path; and
    a vertical transferring device for transferring the first gripping block and the second gripping block in a direction perpendicular to the predetermined circulation path;
    wherein the vertical transferring device includes:
        a first vertical transfer for transferring the first gripping block in the direction perpendicular to the predetermined circulation path, and
        a second vertical transfer for transferring the second gripping block in the direction perpendicular to the predetermined circulation path independently from the first vertical transfer.

2. The test tray transferring apparatus for a test handler according to claim 1,
    wherein the gripping block actuating device comprises:
    a first gripping block actuator for actuating the first gripping block; and
    a second gripping block actuator for actuating the second gripping block independently from the first gripping block actuator.

3. The test tray transferring apparatus for a test handler according to claim 1,
    wherein the gripping block transferring device comprises:
    a connection frame provided to move in the circulation direction of the predetermined circulation path and including a side with which the first gripping block and the second gripping block are connected to be actuated;
    a power source for providing a driving force required to transfer the connection frame in the circulation direction of the predetermined circulation path; and
    a power transmission for transmitting the driving force generated from the power source to the connection frame.

4. The test tray transferring apparatus for a test handler according to claim 1, wherein the first vertical transfer comprises:
    a first vertical transferring member coupled with the connection frame to move in the direction perpendicular to the predetermined circulation path and including a side with which the first gripping block is coupled to be actuated; and
    a first power source for providing a driving force to transfer the first vertical transferring member in the direction perpendicular to the predetermined circulation path; and
    wherein the second vertical transfer comprises:
    a second vertical transferring member coupled with the connection frame to move in the direction perpendicular to the predetermined circulation path and including a side with which the second gripping block is coupled to be actuated; and
    a second power source for providing a driving force to transfer the second vertical transferring member in the direction perpendicular to the predetermined circulation path.

5. A test handler comprising:
    a loading apparatus for loading semiconductor devices loaded in customer trays into a test tray at a loading position;
    a test chamber for assisting a test for the semiconductor devices loaded in the test tray that is completely loaded by the loading apparatus;
    an unloading apparatus for unloading the tested semiconductor devices loaded in the test tray, transferred to an unloading position via the test chamber to the customer trays; and
    a test tray transferring apparatus of claim 1.

6. A method of transferring test trays for a test handler comprising:
- (a) gripping the test trays respectively by a first gripping block and a second gripping block;
- (b) transferring the respective test trays in a circulation direction by moving the first gripping block and the second gripping block in the circulation direction together;
- (c) releasing the test tray by the first gripping block;
- (d) transferring the test tray gripped by the second gripping block in the circulation direction by moving the first gripping block and the second gripping block in the circulation direction together;
- (e) releasing the test tray by the second gripping block; and
- (f) moving the first gripping block and the second gripping block in a direction reverse to the circulation direction together;

wherein the step (c) comprises:
moving the first gripping block backward, and
elevating the first gripping block; and
wherein the step (e) comprises:
moving the second gripping block backward, and
elevating the second gripping block.

7. A method of transferring test trays for a test handler comprising:
- (a) releasing a test tray by a first gripping block and griping a test tray by a second gripping block;
- (b) transferring the test tray gripped by the second gripping block in a circulation direction by moving the first gripping block and the second gripping block in the circulation direction together;
- (c) releasing the test tray by the second gripping block;
- (d) moving the first gripping block and the second gripping block in a direction reverse to the circulation direction together;
- (e) gripping the test trays respectively by the first gripping block and the second gripping block; and
- (f) transferring the respective test trays in the circulation direction by moving the first gripping block and the second gripping block in the circulation direction together;

wherein the step (a) comprises:
moving the first gripping block backward, and
elevating the first gripping block; and
wherein the step (c) comprises:
moving the second gripping block backward, and
elevating the second gripping block.

* * * * *